United States Patent
Sasaki

(10) Patent No.: US 12,038,396 B2
(45) Date of Patent: Jul. 16, 2024

(54) CRYSTAL DEFECT OBSERVATION METHOD FOR COMPOUND SEMICONDUCTOR

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 387 days.

(21) Appl. No.: 17/624,840

(22) PCT Filed: Nov. 1, 2019

(86) PCT No.: PCT/JP2019/043132
§ 371 (c)(1),
(2) Date: Jan. 4, 2022

(87) PCT Pub. No.: WO2021/084755
PCT Pub. Date: May 6, 2021

(65) Prior Publication Data
US 2022/0268715 A1    Aug. 25, 2022

(51) Int. Cl.
*G01N 23/20058*    (2018.01)
*G01N 23/2251*    (2018.01)
*H01J 37/295*    (2006.01)

(52) U.S. Cl.
CPC ... *G01N 23/20058* (2013.01); *G01N 23/2251* (2013.01); *H01J 37/295* (2013.01); *G01N 2223/418* (2013.01)

(58) Field of Classification Search
CPC ......... G01N 23/20058; G01N 23/2251; G01N 2223/418; G01N 2223/6116;
(Continued)

(56) References Cited

U.S. PATENT DOCUMENTS

| | | | |
|---|---|---|---|
| 6,252,261 B1 | 6/2001 | Usui et al. | |
| 6,855,996 B2 * | 2/2005 | Noguchi | H10N 30/877 257/419 |

(Continued)

FOREIGN PATENT DOCUMENTS

| | | |
|---|---|---|
| JP | 2000-349338 A | 12/2000 |
| JP | 2004-311700 A | 11/2004 |

(Continued)

OTHER PUBLICATIONS

International Search Report issued in PCT/JP2019/043132; mailed Jan. 21, 2020.

(Continued)

*Primary Examiner* — David A Vanore
(74) *Attorney, Agent, or Firm* — Studebaker & Brackett PC

(57) ABSTRACT

A sample (4) is created by cutting out a device on a plane (10-10). The device has a gate electrode (3) formed along a direction [2-1-10] on a plane c (0001) of a compound semiconductor (1) having a wurtzite structure. Edge dislocations having Burgers vectors of 1/3[2-1-10] and 1/3[−2110] and mixed dislocations having Burgers vectors of 1/3[2-1-13] and 1/3[−2113] are observed by making an electron beam (5) incident on the sample (4) from a direction [−1010] using a transmission electron microscope.

3 Claims, 9 Drawing Sheets

(58) Field of Classification Search
CPC ........... G01N 2223/6462; H01J 37/295; H01L 29/2003; H01L 29/778; H01L 29/045
See application file for complete search history.

(56) References Cited

U.S. PATENT DOCUMENTS

| | | | |
|---|---|---|---|
| 6,888,867 B2* | 5/2005 | Sawaki | H01S 5/32341 |
| | | | 372/46.01 |
| 7,087,114 B2* | 8/2006 | Motoki | C30B 29/406 |
| | | | 117/85 |
| 2003/0145783 A1* | 8/2003 | Motoki | C30B 25/02 |
| | | | 117/89 |
| 2006/0128124 A1 | 6/2006 | Haskell et al. | |
| 2010/0200956 A1 | 8/2010 | Shibata et al. | |
| 2011/0062437 A1* | 3/2011 | Chang | H01L 21/02538 |
| | | | 257/E29.094 |
| 2013/0240876 A1* | 9/2013 | Chang | C30B 23/08 |
| | | | 117/106 |
| 2015/0004435 A1* | 1/2015 | Chang | H01L 21/02609 |
| | | | 117/106 |
| 2020/0066480 A1 | 2/2020 | Amino et al. | |
| 2022/0268715 A1* | 8/2022 | Sasaki | G01N 23/2251 |
| 2023/0170213 A1* | 6/2023 | D'Evelyn | H01L 21/02389 |
| | | | 438/478 |

FOREIGN PATENT DOCUMENTS

| | | | | |
|---|---|---|---|---|
| JP | 2004-327766 A | 11/2004 | | |
| JP | 2010-4074 A | 1/2010 | | |
| JP | 2017-147464 A | 8/2017 | | |
| JP | 6521205 B1 | 5/2019 | | |
| JP | 6780805 B1 * | 11/2020 | ....... G01N 23/20058 |
| WO | WO-2008056530 A1 * | 5/2008 | ............ B82Y 20/00 |
| WO | 2009/035079 A1 | 3/2009 | | |

OTHER PUBLICATIONS

Office Action; "Notice of Reasons for Refusal," mailed by the Japanese Patent Office on Jun. 16, 2020, which corresponds to Japanese Patent Application No. 2020-511411 with partial English language translation.

* cited by examiner $z=[\bar{1}010]$

CRYSTAL DEFECT OBSERVATION METHOD FOR COMPOUND SEMICONDUCTOR

FIELD

The present disclosure relates to a crystal defect observation method for a compound semiconductor using a transmission electron microscope.

BACKGROUND

In recent years, GaN has been used as a material of a high-power and high-efficiency high-frequency device and blue light-emitting device. Crystal defects are more likely to occur in GaN than in Si and GaAs. Thus, an effort to decrease density of crystal defects which negatively affect a device has been made. While defects which have extremely poor quality like stacking faults and micropipes have not occurred any more in recent years, linear threading dislocations called dislocations still exist at high density. It is important to decrease dislocation density by grasping the types and density of dislocations and providing feedback to the process.

Methods for observing dislocations include an etch-pit method which utilizes KOH etching. However, when a device pattern is formed, it is difficult to observe dislocations, and it is not easy to identify types of the dislocations. Thus, a method by which dislocations are observed using a transmission electron microscope (hereinafter, described as a TEM) is the best method.

A method by which a cross section of a semiconductor device is observed at high magnification using a TEM is referred to as cross-sectional TEM. It is necessary to make electrons incident from a cross-sectional direction, and thus, a sample for observation is typically thinly sliced. The sample which is thinly sliced is attached to a copper or molybdenum mesh and set inside a TEM apparatus, and a magnified image or a diffraction image is observed by irradiating the sample with electron beams. Crystal defects such as dislocations or stacking faults largely affect characteristics and reliability of the device, and thus, analysis using a TEM is actively performed. Influence on a device is different depending on types of crystal defects, and thus, it is insufficient to simply confirm existence of a defect, and detailed analysis is required.

A crystal defect appears or disappears on a screen of an electron microscope by changing diffraction conditions. It is therefore necessary to observe a crystal defect in view of a crystal structure, a diffraction vector of an electron beam and a Burgers vector of the crystal. GaN which is used as a material of the device has a wurtzite structure and has a crystal axis which is not perpendicular compared to Si having a diamond structure and GaAs having a zinc blende structure, and thus, its analysis is complicated. Perfect dislocations of the wurtzite structure include an edge dislocation, a screw dislocation and a mixed dislocation. It is necessary to select a diffraction (reflection) vector to determine types of respective dislocations using a TEM (see, for example, PTL 1).

CITATION LIST

Patent Literature

[PTL 1] JP2000-349338 A

SUMMARY

Technical Problem

The sample is slightly inclined when the diffraction vector is selected. If the sample is inclined by equal to or greater than five degrees, a crystal zone axis transitions to another crystal zone axis, which makes it impossible to make an analysis as in the related art. In a case of GaN, Burgers vectors of the edge dislocation and the mixed dislocation face in three directions. In a case where an inner product of a diffraction vector g and a Burgers vector b is zero (g·b=0), dislocations disappear from a screen of the transmission electron microscope and pass out of view. Thus, there is a problem that it is impossible to perform observation while identifying dislocations existing in a compound semiconductor having a wurtzite structure.

The present invention has been made to solve the problem as described above, and an object of the present invention is to provide a crystal defect observation method for a compound semiconductor which is capable of performing observation while identifying dislocations existing in the compound semiconductor having a wurtzite structure.

Solution to Problem

A crystal defect observation method for a compound semiconductor according to the present disclosure includes: creating a sample by cutting out a device on a plane (10-10), the device having a gate electrode formed along a direction [2-1-10] on a plane c (0001) of a compound semiconductor having a wurtzite structure; and observing edge dislocations having Burgers vectors of 1/3[2-1-10] and 1/3[−2110] and mixed dislocations having Burgers vectors of 1/3[2-1-13] and 1/3[−2113] by making an electron beam incident on the sample from a direction [−1010] using a transmission electron microscope.

Advantageous Effects of Invention

In the present disclosure, the sample is created by cutting out the device, in which the gate electrode is formed along a direction [2-1-10] on the plane c (0001) of a compound semiconductor having a wurtzite structure, on the plane (10-10), and an electron beam is made incident on the sample from the direction [−1010]. Thus, it is possible to perform observation while identifying dislocations existing in a compound semiconductor having a wurtzite structure.

DESCRIPTION OF EMBODIMENTS

A crystal defect observation method for a compound semiconductor according to the embodiments of the present disclosure will be described with reference to the drawings. The same components will be denoted by the same symbols, and the repeated description thereof may be omitted.

First Embodiment

Figure 1:
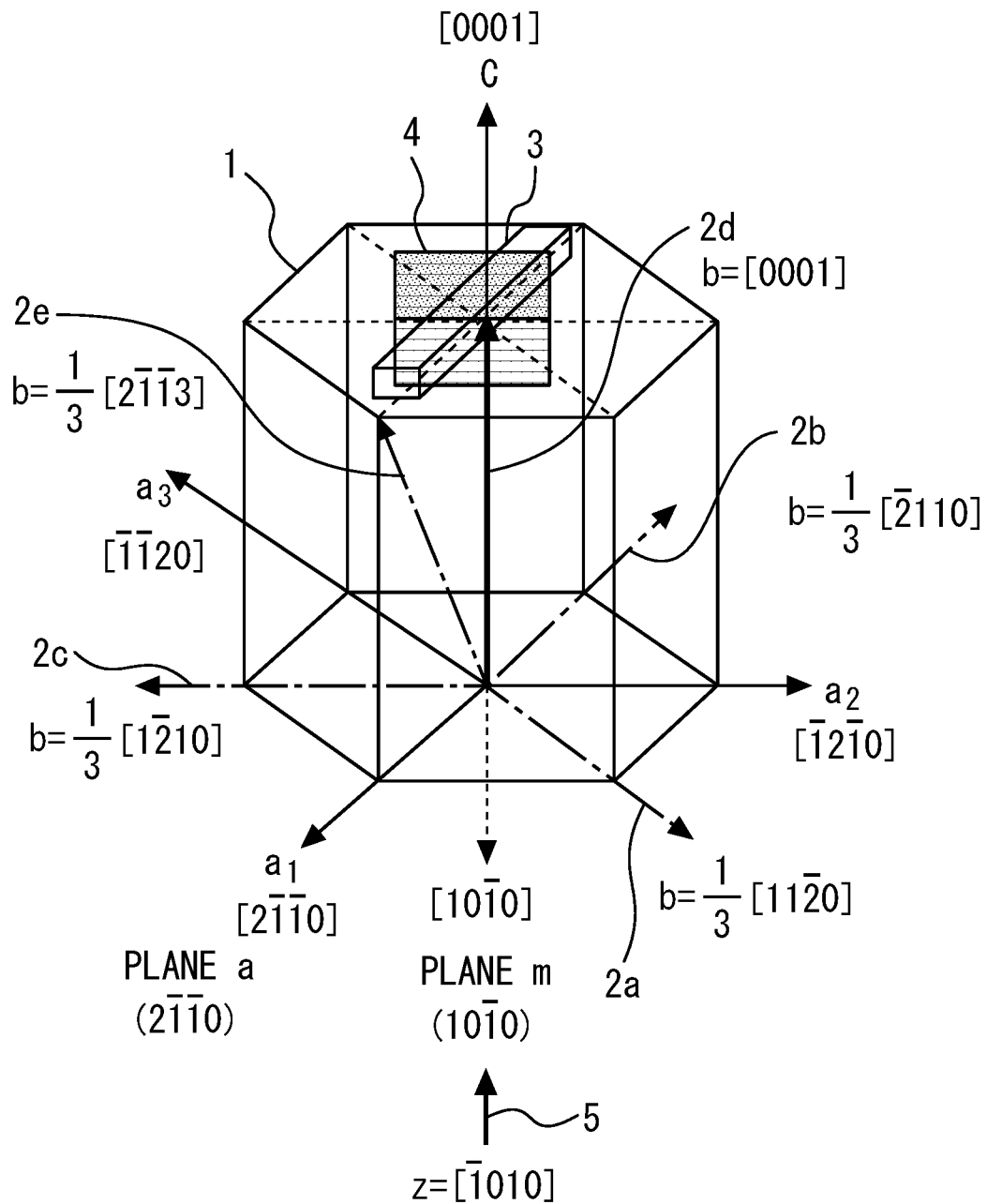
FIG. 1 is a view illustrating a crystal defect observation method for a compound semiconductor according to a first embodiment.

FIG. 1 is a view illustrating a crystal defect observation method for a compound semiconductor according to a first embodiment. A unit lattice of GaN 1 which is a compound semiconductor having a wurtzite structure is illustrated. GaN 1 has crystal axes respectively in three directions of a1, a2 and a3 which are perpendicular to an axis c.

Burgers vectors of perfect dislocations of GaN 1 are broadly classified into three types. Dislocations 2a, 2b and 2c having Burgers vectors which are perpendicular to the axis c are called edge dislocations. A dislocation 2d having a Burgers vector in a direction of the axis c is called a screw dislocation. A dislocation 2e which is mixture of the edge dislocation and the screw dislocation is called a mixed dislocation.

While the dislocation 2e exists on the same plane as the dislocation 2b and is inclined in a positive direction of a direction a1, there also exists a mixed dislocation which is inclined in a negative direction inversely. Mixed dislocations which are inclined in a negative direction also exist on the planes of the dislocations 2a and 2c. Thus, there exist six types of mixed dislocations.

Planes perpendicular to the directions a1, a2 and a3 are collectively referred to as a plane a (2-1-10). Planes rotated from the plane a (2-1-10) by 30 degrees are collectively referred to as a plane m (10-10). A typical GaN device such as a GaN HEMT is formed on a plane c (0001) which is perpendicular to the axis c. A gate electrode 3 is formed along a direction [2-1-10] on the plane c (0001) of GaN 1. While not illustrated for simplicity, normally, a drain electrode and a source electrode are also formed in a direction parallel to the gate electrode 3.

A sample 4 is created by cutting out this device on the plane m (10-10) which is oblique with respect to the gate electrode 3. An electron beam 5 is made incident on the sample 4 from a direction [-1010] using a transmission electron microscope (hereinafter, described as a TEM). After an incident direction is accurately aligned with a crystal zone axis of a crystal, the axis c is slightly inclined in a ±a1 direction by a few degrees to make adjustment so that a spot of (-12-10) of the diffraction vector is excited. As a result of this, edge dislocations having Burgers vectors of 1/3[2-1-10] and 1/3[-2110] and mixed dislocations having Burgers vectors of 1/3[2-1-13] and 1/3[-2113] are observed. Note that dislocations having equivalent Burgers vectors can be observed in a similar manner.

Figure 2:
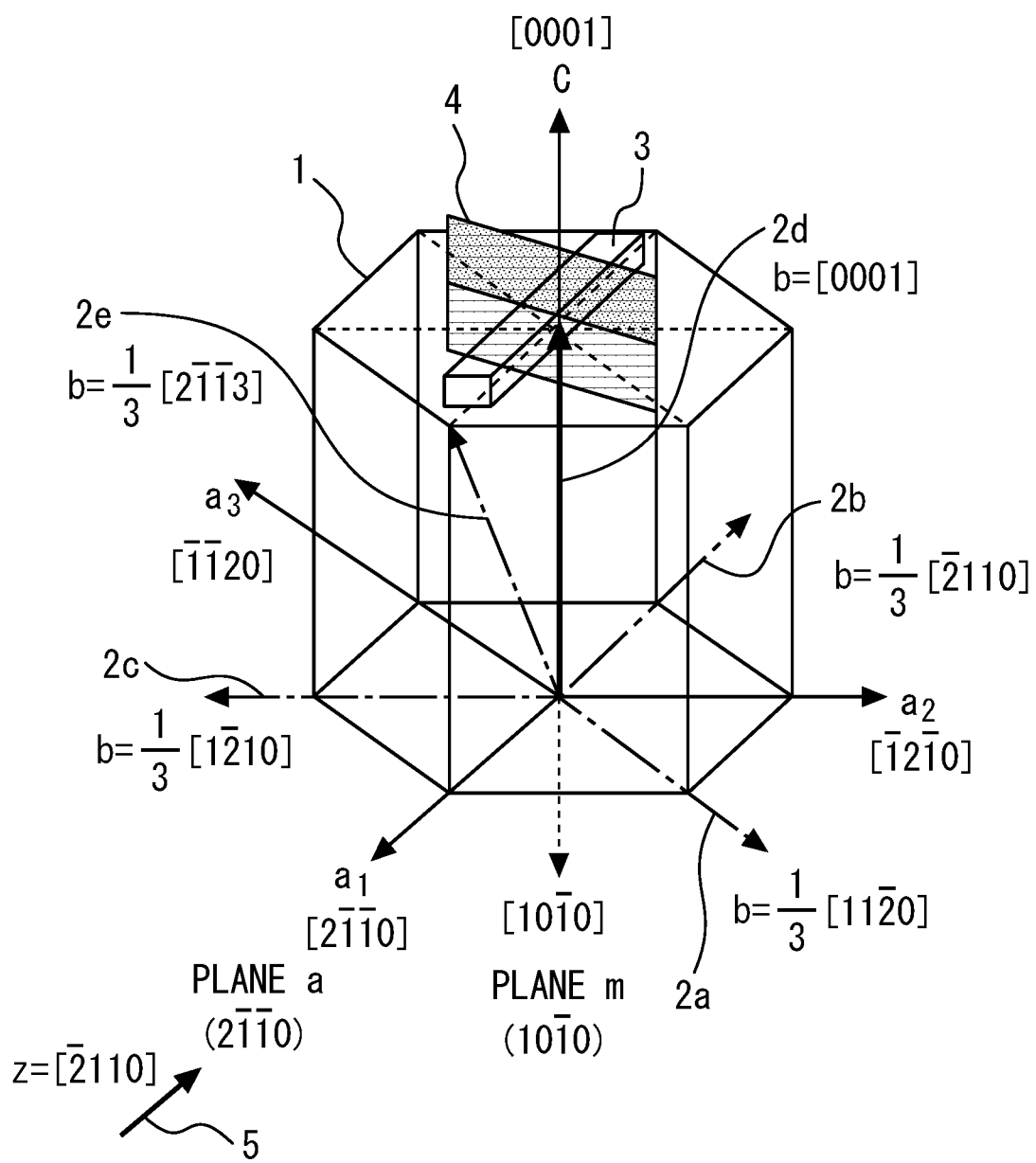
FIG. 2 is a view illustrating a crystal defect observation method for a compound semiconductor according to a comparative example.

Subsequently, effects of the present embodiment will be described while being compared with a comparative example. FIG. 2 is a view illustrating a crystal defect observation method for a compound semiconductor according to a comparative example. In the comparative example, the sample 4 is created by cutting out the device on the plane a (2-1-10) which is perpendicular to the gate electrode 3. Then, an electron beam is made incident on the sample 4 from a direction [-2110] which is perpendicular to the cross section using the TEM. After an incident direction is accurately aligned with a crystal zone axis of the crystal, the axis c is slightly inclined in the ±a1 direction by a few degrees to make adjustment so that a spot of (01-10) of the diffraction vector is excited. This makes it possible to observe part of the edge dislocations and the mixed dislocations. An inner product of the Burgers vector b and the diffraction vector g becomes zero (g·b=0) for the screw dislocation, and thus, the screw dislocation disappears on the screen of the transmission electron microscope and cannot be observed. In the comparative example, inner products for the dislocations 2b and 2e which are edge dislocations also become zero (g·b=0), and thus, cannot be observed.

In contrast, in the present embodiment, the sample 4 is created by cutting out the device while inclining the device by 30 degrees with respect to the gate electrode 3, and dislocations is observed by making an electron beam incident on the sample 4 from the direction [-1010]. This can avoid an extinction rule of the inner product of the diffraction vector g and the Burgers vector b being zero (g·b=0), so that it is possible to perform observation while identifying all edge dislocations and mixed dislocations existing in a compound semiconductor having a wurtzite structure.

Note that dislocations can be observed also in the comparative example by making an electron beam incident from a direction oblique by 30 degrees. However, the latest TEMs often cannot make the sample 4 inclined at a high angle as a result of priority being put on functions of observation at high magnification. In contrast, the crystal defect observation method of the present embodiment can be applied to all TEMs.

Second Embodiment

Figure 3:
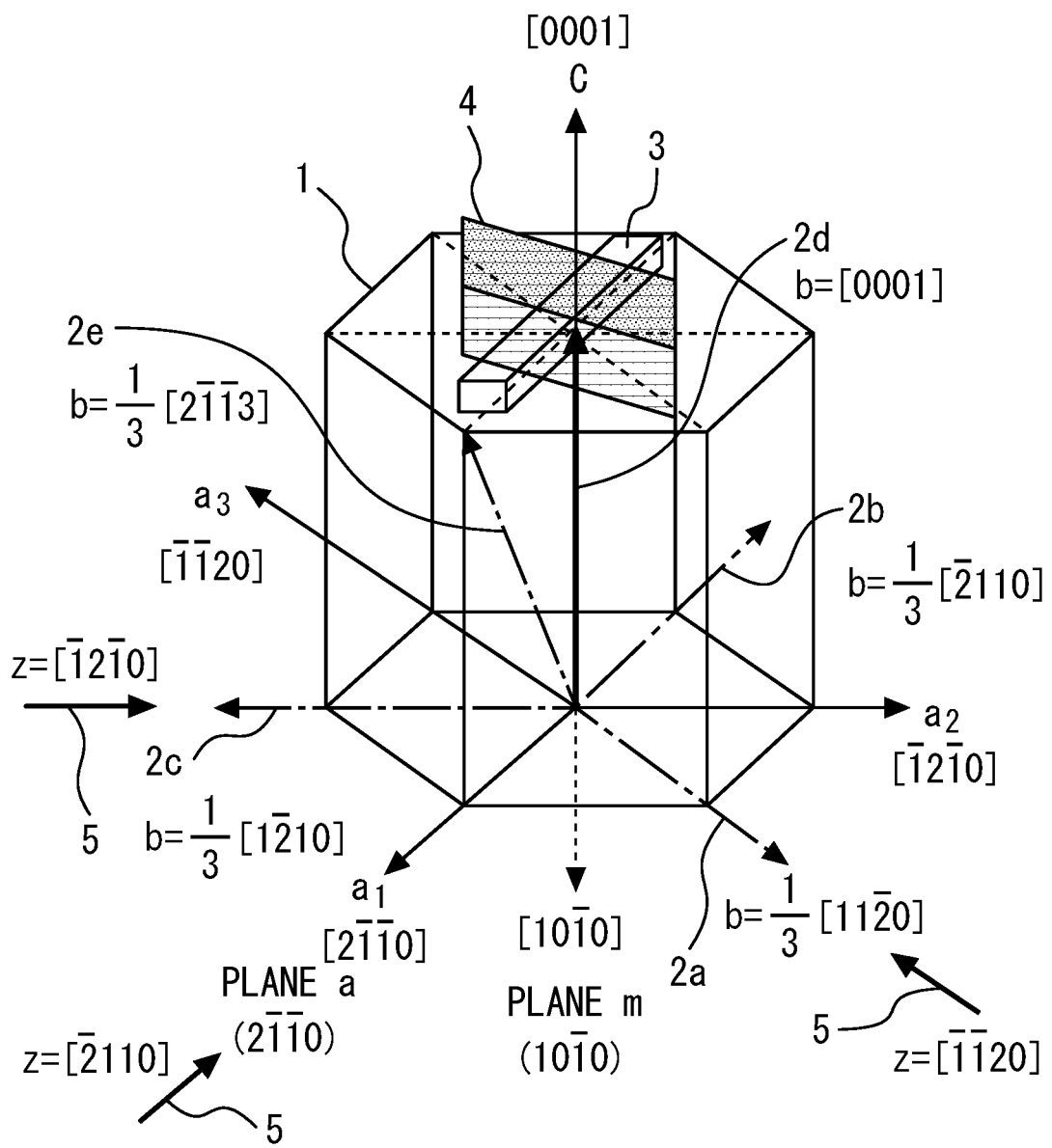
FIG. 3 is a view illustrating a crystal defect observation method for a compound semiconductor according to a second embodiment.

FIG. 3 is a view illustrating a crystal defect observation method for a compound semiconductor according to a second embodiment. In a similar manner to the first embodiment, the gate electrode 3 is formed along the direction [2-1-10] on the plane c (0001) of GaN 1 which is a compound semiconductor having a wurtzite structure. In the present embodiment, in a similar manner to the comparative example, the sample 4 is created by cutting out the device on the plane (2-1-10) which is perpendicular to the gate electrode 3.

Observation is performed while the electron beam 5 is made incident on the sample 4 from the direction [-2110] using the TEM in a similar manner to a normal observation method and the electron beam 5 is made incident also from a direction [-1-120] and a direction [-12-10] by rotating the sample 4 within the microscope to incline the sample 4 by 60 degrees. If the electron beam 5 is made incident from the direction [-2110], the edge dislocation 2b satisfies g·b=0, and thus passes out of view.

On the other hand, by making the electron beam 5 incident on the sample 4 from the direction [-1-120], dislocations having Burgers vectors of 1/3[11-20], 1/3[-1-120], 1/3[11-23] and 1/3[-1-123] are made to disappear on the screen of the transmission electron microscope, and dislocations having Burgers vectors of 1/3[-2110], 1/3[2-1-10], 1/3[-2113] and 1/3[2-1-13] are made to appear. Further, by making the electron beam 5 incident on the sample 4 from the direction [-12-10], dislocations having Burgers vectors of 1/3[1-210], 1/3[-12-10], 1/3[1-213] and 1/3[-12-13] are made to disappear. By this means, it is possible to identify dislocations by discerning directions of the Burgers vectors of dislocations derived from a1, a2 and a3.

Third Embodiment

Figure 4:
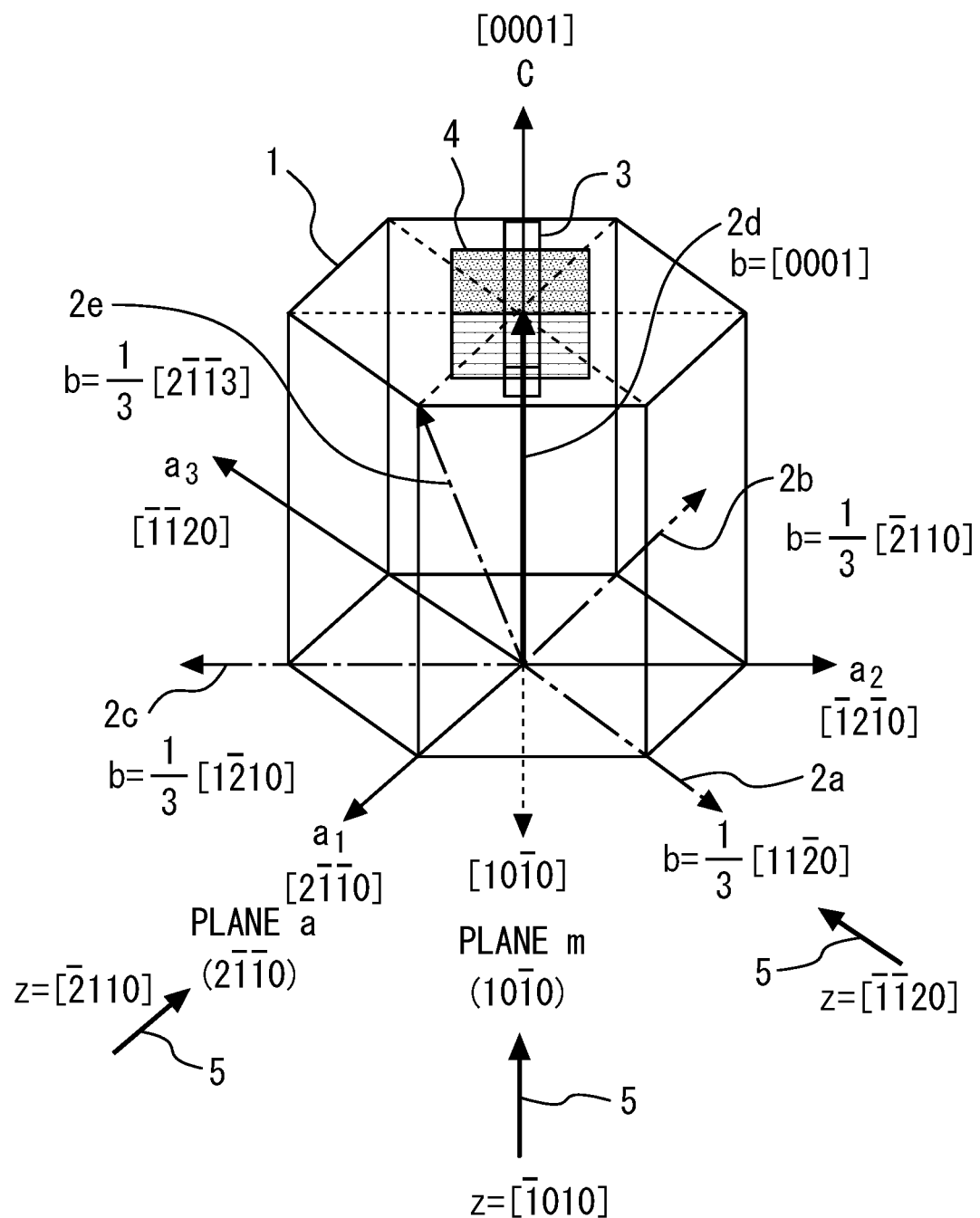
FIG. 4 is a view illustrating a crystal defect observation method for a compound semiconductor according to a third embodiment.

FIG. 4 is a view illustrating a crystal defect observation method for a compound semiconductor according to a third embodiment. The gate electrode 3 is formed along a direction [10-10] on the plane c (0001) of GaN 1 which is a compound semiconductor having a wurtzite structure. While a direction in which the gate electrode 3 is formed is different from the direction in the first embodiment, the direction in which the gate electrode is formed is generally different in accordance with manufacturers or systems of manufacturing. The sample 4 is created by cutting out this device on the plane (10-10) which is perpendicular to the gate electrode 3.

Observation is performed while the electron beam 5 is made incident on the sample 4 from the direction [-1010] which is perpendicular to the sample 4 using the TEM and the electron beam 5 is made incident also from the direction [-1-120] and the direction [-2110] by rotating the sample 4 within the microscope to incline the sample 4 by 30 degrees.

By making the electron beam 5 incident on the sample 4 from the direction [-1-120], g·b=0 is satisfied, and dislocations having Burgers vectors of 1/3[11-20], 1/3[-1-120], 1/3[11-23] and 1/3[-1-123] disappear on the screen of the transmission electron microscope. By making the electron beam incident on the sample 4 from the direction [-2110], dislocations having Burgers vectors of 1/3[-2110], 1/3[2-1-10], 1/3[-2113] and 1/3[2-1-10] disappear. By this means, it is possible to identify dislocations by discerning directions of the Burgers vectors of dislocations derived from a1, a2 and a3.

Fourth Embodiment

Figure 5:
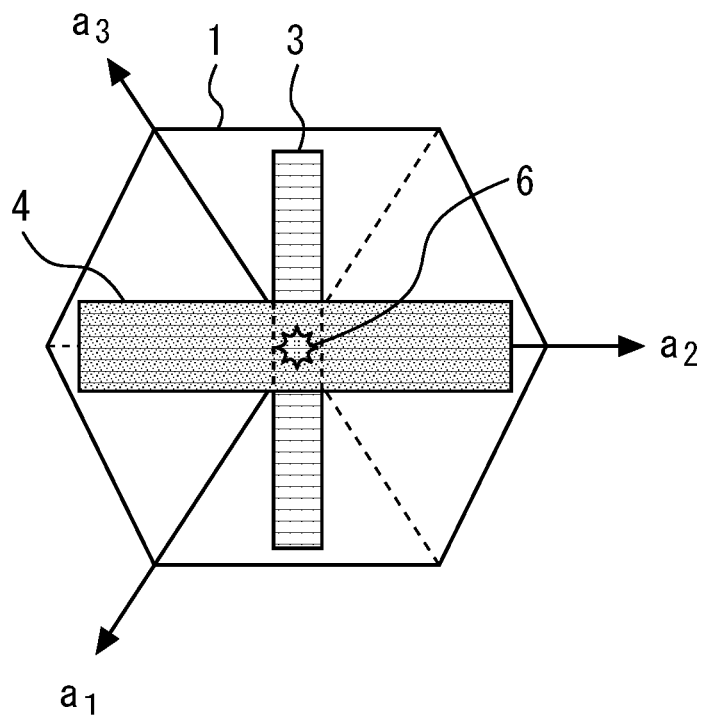
FIG. 5 is a view of the crystal structure in FIG. 4 observed from above along the axis c.

FIG. 5 is a view of the crystal structure in FIG. 4 observed from above along the axis c. In the related art, a position where a crystal defect 6 which is desired to be observed exists is specified through electroluminescence (EL), optical beam induced resistance change (OBIRCH) or heat generation analysis by causing electrical operation in a device state. Then, the sample 4 is created by cutting out the relevant portion using an FIB, or the like. In a case of a normal TEM, an acceleration voltage of an electron beam is from 70 kV to 300 kV, and thus, the sample 4 is required to be made thinner to be from 0.02 μm to 0.3 μm to allow the electron beam to pass through the sample 4. Positioning accuracy of EL, OBIRCH, light emission observation and FIB processing is approximately 1 μm, and thus, there is a case where the portion which is desired to be observed is cut off.

Use of an ultra-high voltage electron microscope is effective to reliably observe the crystal defect 6. The ultra-high voltage electron microscope, which is an electron microscope having an acceleration voltage of an electron of equal to or greater than 1 MV, can achieve acceleration of 3 MV which is maximum in existence. Electron penetrating power is high, so that, in a case of GaN, even the sample 4 having a thickness of 3 μm can be observed in a transmissive manner. It is therefore possible to reliably take out a region which is desired to be observed and observe the region.

Figure 6:
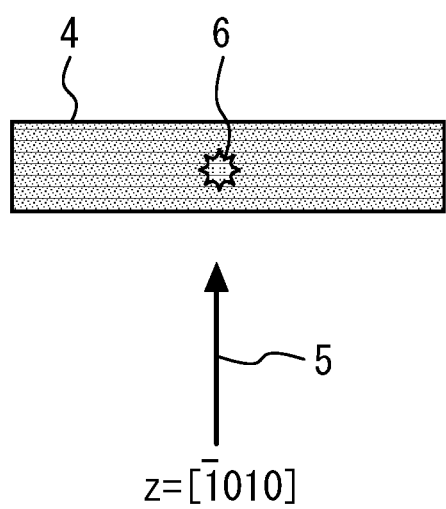
FIG. 6 is a view illustrating a thick-film sample cut out so as to include a crystal defect which is desired to be observed.
Figure 7:
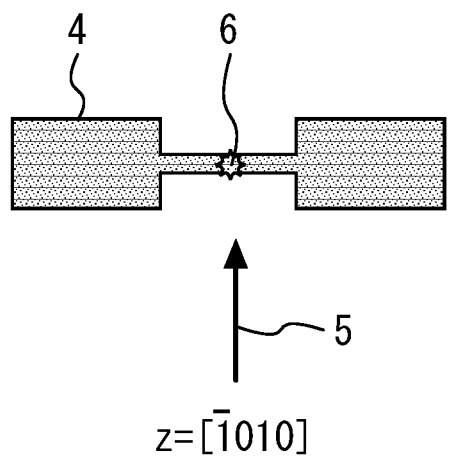
FIG. 7 is a view illustrating an example where the thick-film sample 4a is made further thinner to be used for a normal TEM.

FIG. 6 is a view illustrating a thick-film sample cut out so as to include a crystal defect which is desired to be observed. Observation is performed by making an electron beam of equal to or greater than 1 MV incident on this thick-film sample 4a from, for example, a direction [-1010]. A position of the crystal defect 6 can be specified using a stereo method, or the like. After the position is specified, the thick-film sample 4a is made thinner using an FIB. FIG. 7 is a view illustrating an example where the thick-film sample 4a is made further thinner to be used for a normal TEM. Making the sample thinner enables observation at ultra-high resolution which is high enough to observe an atomic image, detailed analysis of Burgers vectors, and analysis through energy loss spectroscopy.

Figure 8:
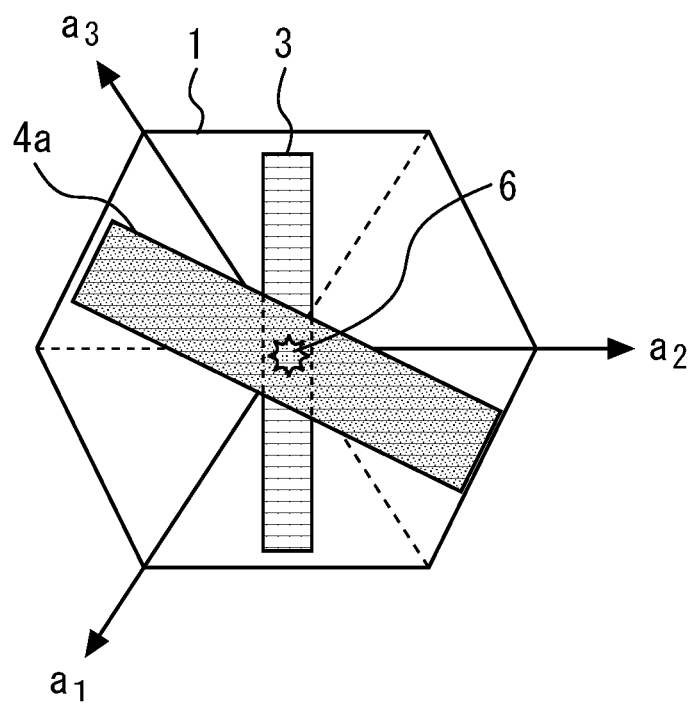
FIG. 8 is a view illustrating a crystal defect observation method for a compound semiconductor according to a fourth embodiment.
Figure 9:
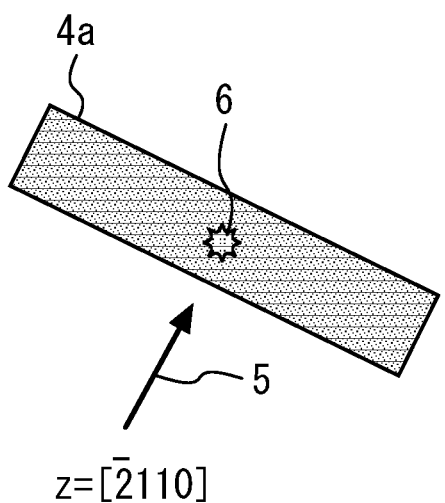
FIG. 9 is a view illustrating a crystal defect observation method for a compound semiconductor according to a fourth embodiment.
Figure 10:
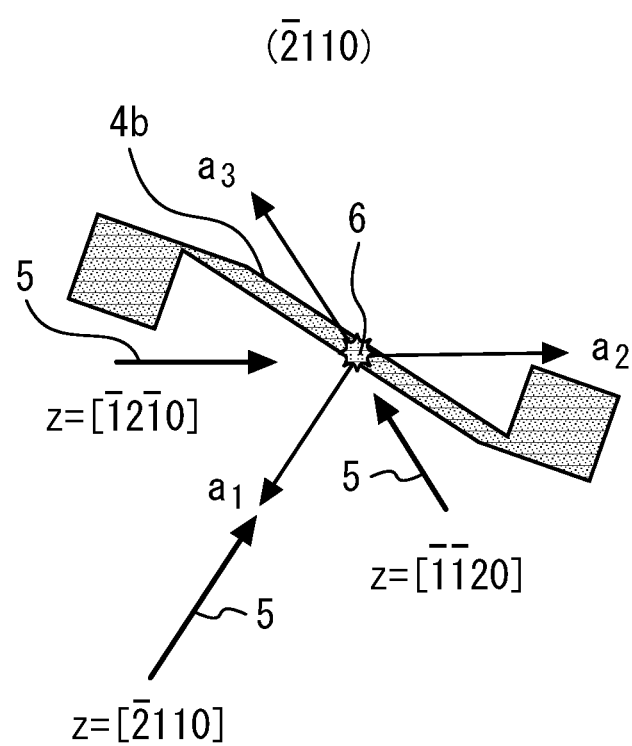
FIG. 10 is a view illustrating a crystal defect observation method for a compound semiconductor according to a fourth embodiment.

FIG. 8 to FIG. 10 are views illustrating a crystal defect observation method for a compound semiconductor according to a fourth embodiment. As illustrated in FIG. 8, a device in which the gate electrode 3 is formed along a direction [10-10] on the plane c (0001) of GaN which has a wurtzite structure is manufactured. Then, as illustrated in FIG. 9, the thick-film sample 4a having a thickness from 0.1 μm to 5 μm is created by cutting out the device on a plane (2-1-10).

The thick-film sample 4a is observed using the ultra-high voltage electron microscope, and a location of the crystal defect 6 is specified through a stereo method, or the like. Then, a thin-film sample 4b is created as illustrated in FIG. 10 by making the thick-film sample 4a obliquely thinner so that a plane (-2110) appears.

The crystal defect 6 is observed by making electron beams incident on the thin-film sample 4b from three directions of [-12-10], [-2110] and [-1-120] using the TEM. This can make also a dislocation derived from a2 which could not be made to disappear using the methods from FIG. 5 to FIG. 7, disappear. It is therefore possible to identify dislocations by making the respective dislocations derived from a1, a2 and a3 disappear and discerning directions of Burgers vectors of all edge dislocations and mixed dislocations.

Fifth Embodiment

Figure 11:
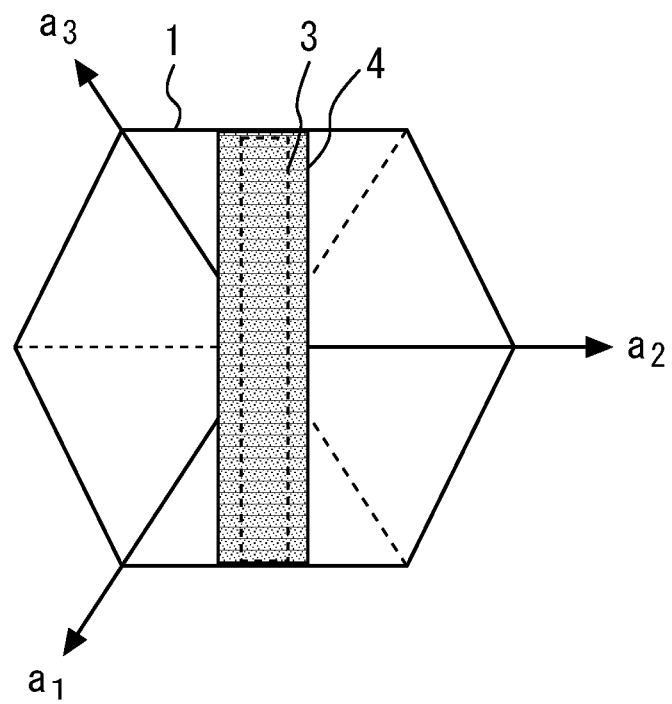
FIG. 11 is a view illustrating a crystal defect observation method for a compound semiconductor according to a fifth embodiment.
Figure 12:
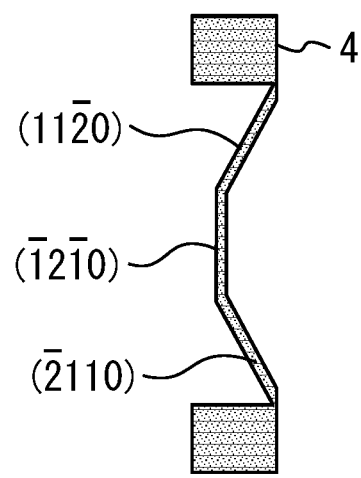
FIG. 12 is a view illustrating a crystal defect observation method for a compound semiconductor according to a fifth embodiment.

FIG. 11 and FIG. 12 are views illustrating a crystal defect observation method for a compound semiconductor according to a fifth embodiment. As illustrated in FIG. 11, the sample 4 having a thickness from 0.1 μm to 5 μm is created by cutting out a device formed on the plane c (0001) of GaN 1 which is a compound semiconductor having a wurtzite structure, in parallel to the gate electrode 3. In a normal thinning method, the cutout sample 4 is made thinner in parallel. Meanwhile, in the present embodiment, as illustrated in FIG. 12, a plurality of thin slices having three or more different plane directions are formed in one sample 4. Here, thin slices having three plane directions of (11-20), (-12-10) and (-2110) are formed in one sample 4. Crystal defects of a plurality of thin slices are observed using the TEM to analyze Burgers vectors. This can reduce work for preparing a sample and work for setting a sample at the TEM compared to a case where a plurality of samples 4 are prepared.

Sixth Embodiment

Figure 13:
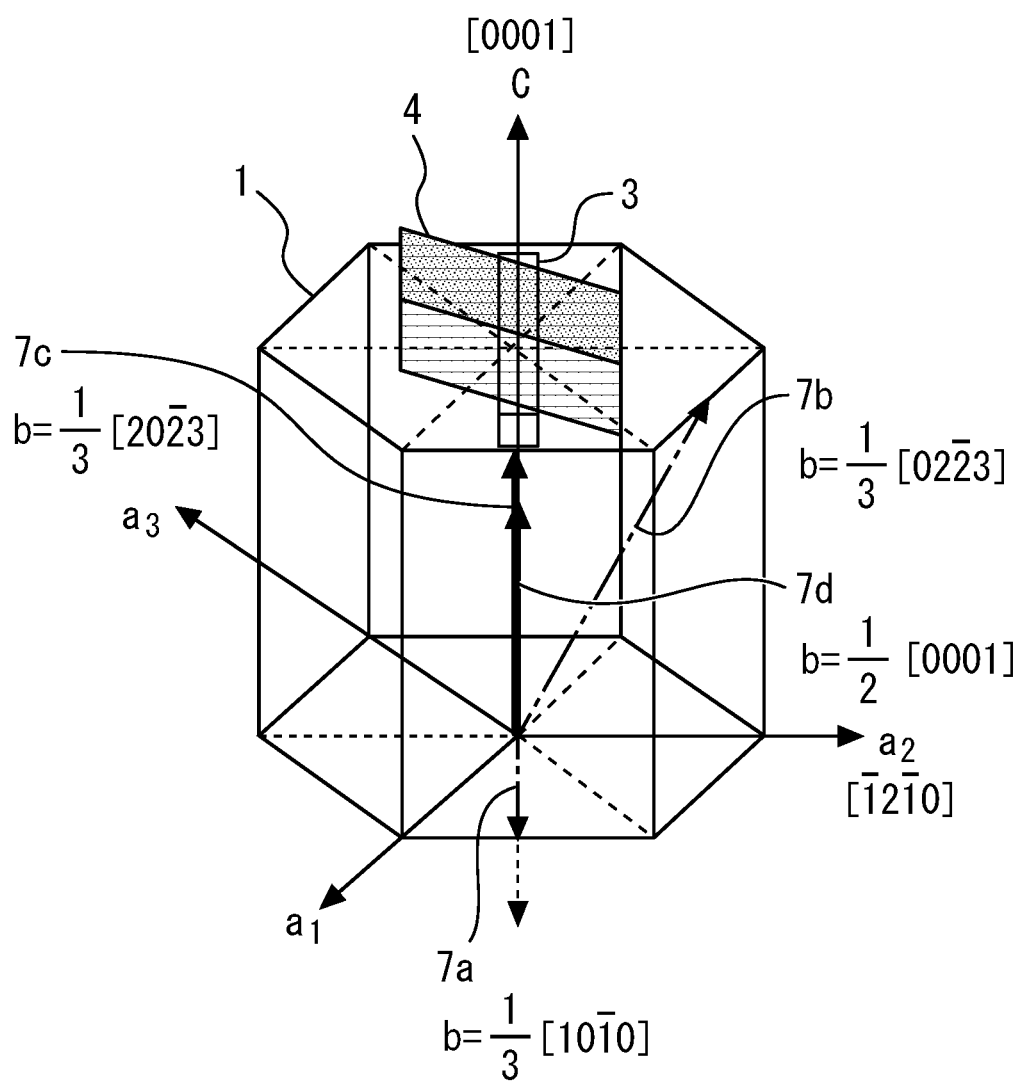
FIG. 13 is a view illustrating a crystal defect observation method for a compound semiconductor according to a sixth embodiment.

FIG. 13 is a view illustrating a crystal defect observation method for a compound semiconductor according to a sixth embodiment. The gate electrode 3 is formed along a direction [10-10] which is perpendicular to the plane m (10-10) on the plane c (0001) of GaN 1 which is a compound semiconductor having a wurtzite structure.

In the wurtzite structure, partial dislocations can exist separately from perfect dislocations described above in the embodiments. Typical examples of the partial dislocations include partial dislocations 7a to 7d having Burgers vectors b of 1/3[10-10], 1/3[02-23], 1/3[20-23] and 1/2[0001]. If the sample 4 is created by cutting out the device on a plane perpendicular to the gate electrode 3 and electron beams are perpendicularly made incident, the partial dislocations 7a and 7c disappear and pass out of view.

In contrast, in the present embodiment, the sample 4 is created by cutting out the above-described device on the plane a (2-1-10) by making the device inclined by 30 degrees with respect to the gate electrode 3. By this means, the partial dislocations 7a and 7c having the Burgers vectors of 1/3[10-10] and 1/3[20-23] of the sample 4 can be observed using the TEM.

Note that while typical Burgers vector analysis methods have been described in the first to the sixth embodiments, an analysis can be made using a similar method also for equivalent other Burgers vectors. Further, while Burgers vector analysis methods for a wurtzite structure have been described, an analysis can be made using a similar method also for other crystal structures.

REFERENCE SIGNS LIST

1 GaN; 2a,2b,2c,2d,2e dislocation; 3 gate electrode; 4 sample; 4a thick-film sample; 4b thin-film sample; 5 electron beam; 6 crystal defect; 7a-7d partial dislocation

The invention claimed is:

1. A crystal defect observation method for a compound semiconductor comprising:
    creating a sample by cutting out a device on a plane (10-10), the device having a gate electrode formed along a direction [2-1-10] on a plane c (0001) of a compound semiconductor having a wurtzite structure; and
    observing edge dislocations having Burgers vectors of 1/3[2-1-10] and 1/3[−2110] and mixed dislocations having Burgers vectors of 1/3[2-1-13] and 1/3[−2113] by making an electron beam incident on the sample from a direction [−1010] using a transmission electron microscope.

2. A crystal defect observation method for a compound semiconductor comprising:
    creating a thick-film sample having a thickness from 0.1 μm to 5 μm by cutting out a device on a plane (2-1-10), the device having a gate electrode formed along a direction [10-10] on a plane c (0001) of a compound semiconductor having a wurtzite structure;
    after specifying a location of a crystal defect by observing the thick-film sample using an ultra-high voltage electron microscope having an acceleration voltage of an electron of equal to or greater than 1 MV, creating a thin-film sample by making the thick-film sample obliquely thinner so that a plane (−2110) appears; and
    observing the crystal defects by making an electron beam incident on the thin-film sample using a transmission electron microscope.

3. A crystal defect observation method for a compound semiconductor comprising:
    creating a sample by cutting out a device on a plane (2-1-10), the device having a gate electrode formed along a direction [10-10] on a plane c (0001) of a compound semiconductor having a wurtzite structure; and
    observing partial dislocations having Burgers vectors of 1/3[10-10] and 1/3[20-23] of the sample using a transmission electron microscope.

* * * * *